United States Patent
Wieland et al.

(10) Patent No.: US 7,667,945 B2
(45) Date of Patent: Feb. 23, 2010

(54) BIPOLAR CARRIER WAFER AND MOBILE BIPOLAR ELECTROSTATIC WAFER ARRANGEMENT

(75) Inventors: Robert Wieland, Munich (DE); Dieter Bollmann, Munich (DE)

(73) Assignee: Fraunhofer-Gesellschaft zur Forderung der Angewandten Forschung e.V., Munich (DE)

(*) Notice: Subject to any disclaimer, the term of this patent is extended or adjusted under 35 U.S.C. 154(b) by 137 days.

(21) Appl. No.: 11/912,828

(22) PCT Filed: Nov. 15, 2006

(86) PCT No.: PCT/EP2006/010963
§ 371 (c)(1),
(2), (4) Date: Oct. 26, 2007

(87) PCT Pub. No.: WO2007/059887
PCT Pub. Date: May 31, 2007

(65) Prior Publication Data
US 2008/0237819 A1     Oct. 2, 2008

(30) Foreign Application Priority Data
Nov. 25, 2005    (DE) .................... 10 2005 056 364

(51) Int. Cl.
*H01L 21/673* (2006.01)
(52) U.S. Cl. ................................. 361/234
(58) Field of Classification Search .......... 361/234, 361/115; 29/825; 437/51; 117/197
See application file for complete search history.

(56) References Cited
U.S. PATENT DOCUMENTS
2,906,984 A * 9/1959 Mucher et al. .............. 338/171
(Continued)

FOREIGN PATENT DOCUMENTS
DE    10232914 A1    2/2004
(Continued)

OTHER PUBLICATIONS
International preliminary report on patentability from PCT/EP2006/010963 dated Aug. 14, 2008.
(Continued)

*Primary Examiner*—Stephen W Jackson
*Assistant Examiner*—Angela Brooks
(74) *Attorney, Agent, or Firm*—Barnes & Thornburg LLP

(57) ABSTRACT

The present invention relates to a bipolar carrier wafer and a mobile, bipolar electrostatic wafer arrangement. Carrier wafers and wafer arrangements of this type can be used in particular in the field of handling technology of semiconductor wafers. The carrier wafer according to the invention serves for mounting a disc-shaped semiconductor component. It has a first surface (2a) as front-side and a second surface (2b) which is situated opposite the first surface (2a) as rear-side. The carrier wafer is configured such that it has a carrier layer (2), an electrically insulating cover layer (3) which surrounds the carrier layer and an electrically conductive layer (4), the latter being disposed on the electrically insulating cover layer and being structured in at least two regions which are separated from each other electrically as electrodes. Electrical contacts are disposed on the rear-side (2b) of the carrier wafer, these electrical contacts being connected to the two electrodes disposed on the front-side (2a). On the electrically conductive layer (4), in addition an electrically insulating cover layer (8) is disposed which covers both the front-side (2a) and the edge of the carrier wafer between the front-side (2a) and the rear-side (2b).

25 Claims, 4 Drawing Sheets

U.S. PATENT DOCUMENTS

Figure 1:
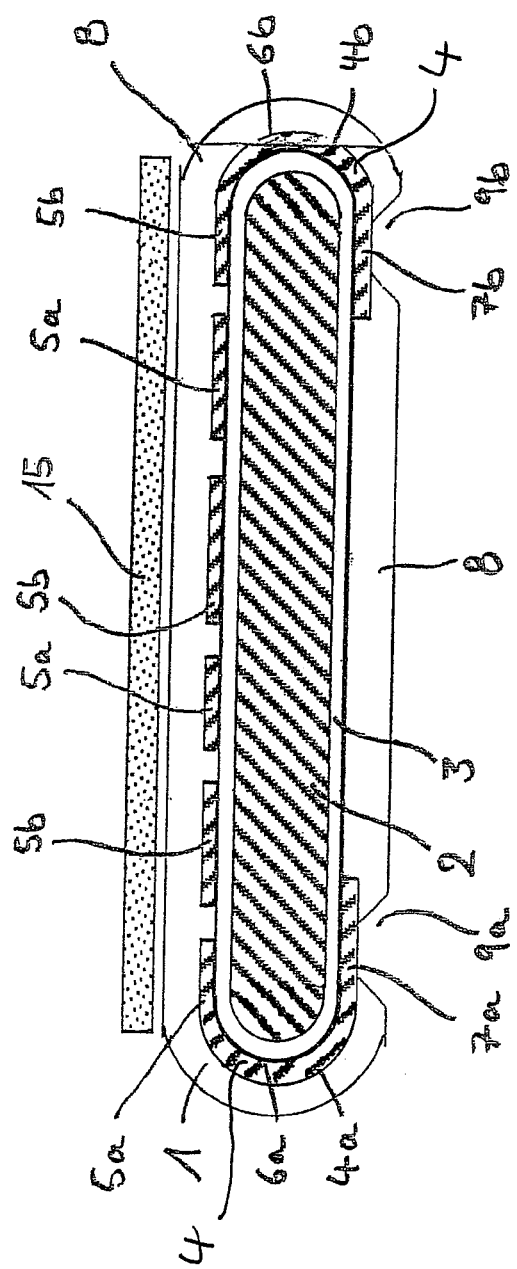

| | | | |
|---|---|---|---|
| 4,724,510 A | 2/1988 | Wicker et al. | |
| 5,094,970 A * | 3/1992 | Yoshida et al. | 438/33 |
| 6,185,085 B1 * | 2/2001 | Hwang et al. | 361/234 |
| 6,557,248 B1 * | 5/2003 | Shamouilian et al. | 29/825 |
| 6,596,648 B2 * | 7/2003 | Wu et al. | 438/745 |
| 6,867,448 B1 * | 3/2005 | Lee et al. | 257/296 |
| 7,027,283 B2 | 4/2006 | Landesberger et al. | |
| 2002/0141134 A1 * | 10/2002 | Frutiger | 361/234 |
| 2002/0160610 A1 * | 10/2002 | Arai et al. | 438/692 |
| 2003/0010280 A1 * | 1/2003 | Sugihara et al. | 117/97 |
| 2004/0173161 A1 | 9/2004 | Mariner et al. | |
| 2007/0258185 A1 * | 11/2007 | Retzlaff | 361/234 |
| 2008/0123241 A1 * | 5/2008 | Bollmann | 361/234 |
| 2008/0258175 A1 * | 10/2008 | Peidous et al. | 257/190 |
| 2009/0053836 A1 * | 2/2009 | Pipitone et al. | 438/10 |

FOREIGN PATENT DOCUMENTS

| | | |
|---|---|---|
| DE | 10238601 A1 | 3/2004 |
| DE | 202004010351 | 9/2004 |
| DE | 10339997 A1 | 3/2005 |
| EP | 1220311 A2 | 7/2002 |
| EP | 1513191 A2 | 3/2005 |
| JP | 59132139 A | 7/1984 |
| WO | WO02/11184 | 2/2002 |
| WO | WO2006/052576 | 5/2006 |

OTHER PUBLICATIONS

International Search Report and Written Opinion for PCT/EP2006/0109637 filed Nov. 15, 2006.

* cited by examiner

BIPOLAR CARRIER WAFER AND MOBILE BIPOLAR ELECTROSTATIC WAFER ARRANGEMENT

This application is the U.S. national phase of PCT/EP2006/010963 filed Nov. 15, 2006. PCT/EP2006/010963 claims the benefit under the Paris Convention of German patent application DE 10 2005 056364.3 filed Nov. 25, 2005. The disclosures of both DE 10 2005 056364.3 and PCT/EP2006/010963 are hereby incorporated herein by reference.

The present invention relates, in the field of semiconductor technology, to the handling technology of semiconductor wafers, in particular thin semiconductor wafers.

Thin semiconductor components have been used widely for several years in the world of microelectronics. The most known example of this is integrated circuits for chip cards in which the thickness of the silicon components nowadays is approx. 150 μm. Also during production of solar cells, increasingly thinner wafers are used in order to save material. Furthermore, power semiconductors with chip thicknesses of approx. 100 μm represent an important segment of the market.

A further reduction in chip thickness to below 50 μm offers several great advantages:

Firstly, very flat housing forms can be produced, as are necessary for portable electronic devices (mobile phone, camera equipment, notebook). Even in the case of RFID tags (high frequency identification transponders), very thin chips without any housing are used.

Secondly, the performance of components in which a current flow is effected vertically relative to the chip rear-side is improved. This applies particularly to power components and solar cells.

And thirdly, mechanically flexible silicon chips which are outstandingly suitable for economical mounting processes on flexible substrates are produced by thinning the circuit wafers to thicknesses below 30 μm.

Even the vertical integration of chips or respectively wafers to be stacked, which are still being developed with the aim of producing vertical electrical connections as direct through-contacting through thinned silicon substrates, requires ultrathin wafers or ultrathin chips in the thickness range of typically 10 to 30 μm silicon thickness.

These applications are not restricted to silicon but can be transferred also to other semiconductor materials, such as silicon-germanium, gallium arsenide, silicon carbide, III-V semiconductors, such as AlGaAsP for optoelectronics or pyroelectric materials, such as $LiNbO_3$ for telecommunications. With these materials, new handling technology is sought even more urgently because the ultrathin wafers with these materials are significantly more at risk of fracture and are more expensive and more difficult to machine than silicon.

Ultrathin wafers in the sense of this invention are wafers made of monocrystalline, polycrystalline or amorphous semiconductor material, which are so thin that they present, in normal machining devices, a risk of breakage which is not economically acceptable.

The thickness thereby normally falls below 1/10 mm. Thicknesses of 50 to 10 μm are of particular interest economically. However it should consequently also be possible to handle layers of a few μm ($\leqq 10$ μm). This carrier technology can be applied also to insulating materials, such as ultrathin glass panes, quartz, sapphire and the like.

Without suitable support from a carrier technology, these ultrathin wafers have a tendency to roll up spontaneously due to internal stresses.

In order to be able to machine these ultrathin semiconductors, it is of basic importance to develop a suitable handling technology. Monocrystalline silicon is a brittle material which breaks easily with small mechanical loads. This danger of wafer breakage presently represents the greatest technical problem when producing ultrathin semiconductors. In addition, ultrathin wafers lose their usual stability and bend by several millimeters even as a result of their own weight and inertia. Hence normal handlers, which remove the wafers from a rack and supply them to various machining stations, can no longer be used. Also the sharp-edged edges of the thinly ground wafers lead to problems during transportation. The frequent readjustment of the handlers to the respective deformation of the wafers at the respective thickness and layer construction is uneconomical and prone to error.

Known from prior art is handling of thin wafers by gluing onto a carrier plate. The essential step hereby is the support of the thin usable wafer by means of a carrier wafer of normal thickness. The connection of the two wafers is thereby effected by wax, a thermoplastic adhesive or a foil which adheres on both sides and can be detached again by the effect of temperature or irradiation with UV light. For many machining devices, such as grinders, spin-etchers or measuring devices, this foil is applied successfully. However if in the case of plasma plants, furnaces or layer depositions, the machining temperature is higher than approx. 150° C., the foil can be destroyed and lose the adhesive function thereof. Because any adhesive reacts sensitively to certain chemicals, this adhesion cannot be used in baths with solvents, acids or the like. After the completion of machining and detachment of the usable wafer or of the wafer to be processed, residues of the adhesive layer are sometimes observed on the surface of the usable wafer, which leads to impermissible contamination of the plants.

A perforated carrier wafer is described in the publications DE 102 38 601 A1 and DE 102 32 914 A1, said carrier wafer working with an initially liquid adhesive. After machining, the usable wafer is detached by a solvent which penetrates through the pores of the carrier wafer. Here also, the mentioned problems of limited temperature tolerability, limited resistance to chemicals and possible contamination occur.

A Bernoulli vacuum gripper was developed by Carinthian Tech Research, Villach which produces a constant air gap as a result of a skillfully configured airflow between carrier wafer and useful wafer according to the Bernoulli principle. Hence a thin wafer can be transported from a rack into a plant and back. However this is only possible in surroundings at atmospheric pressure. In plants with a vacuum or low pressure, this method fails and the thin wafer must be retained in another manner. Also lateral fixing and rotation of the usable wafer are problematic.

Furthermore, in plasma plants the principle of the electrostatic chuck (E-chuck) is known:

After placing the wafer to be machined on the electrostatic chuck, the desired chamber pressure is set in the vacuum chamber of the reactor initially after adjusting the gas flows. Then with the help of a generally high-frequency alternating voltage field, the plasma is ignited and the corresponding etching or deposition step is initiated. At the same time, a direct voltage is applied between the anode of the reactor and the rear-side of the electrostatic chuck via a separate high-voltage supply. The electrical field resulting therefrom between the wafer rear-side and the insulation layer of the chuck retains the wafer and permits inter alia rear-side cooling of the wafer by applying a flow of small quantities of He gas. Normally, the insulation layer of an electrostatic chuck consists of temperature-resistant plastic materials or ceramic materials. Cooling channels on the chuck surface ensure corresponding heat dissipation on the wafer rear-side in order to keep the wafer temperature as constant as possible and to dissipate the quantities of heat introduced by plasmas.

Hence a thin wafer could be retained and machined precisely like a wafer of normal thickness. However this mentioned electrostatic chuck is a fixed component of the plant. Before and after machining, the wafer must be removed by a handler and transported. This is however no longer possible as a result of the above-described problems of elastic deflection and the risk of breakage in the case of ultrathin wafers.

A unipolar electrostatic chuck is described in the Japanese Patent JP 59 132 139 A. A permanent retaining force is produced by applying a high voltage between a plate and a wafer by polarisation of a dielectric layer. Even after removing the cable, the permanent retaining force is maintained. However, nothing is mentioned about the dimension of this arrangement or the mobility and hence the usability during transportation or in machining devices.

A bipolar mobile holder is described in WO 02/11184 A1 which mounts a wafer on a base element by electrostatic force. A functional layer here obtains an electrostatically active state even without external voltage supply. However, here two electrodes are described on the same side of the holder and are contacted from the front-side in the region of the flat.

Electrostatic carrier wafers can also be produced from ceramic material. With this, a thin wafer can be machined in many plants.

However the different heat expansion coefficient of silicon and ceramic presents problems. The carrier wafer can be distorted significantly in the hot state. Even in the resting state, it is not sufficiently level. Experience shows a temporally limited retaining force of the ceramic carrier wafer, which can be attributed to a leakage current in the ceramic which increases with temperature. Impure and inexactly specified materials, such as ceramic and screen printing pastes, are also suspect with respect to ensuring a clean chamber since the danger of contamination with metals is present.

Also electrostatic carrier wafers made of plastic material do not offer a satisfactory solution because even these are restricted in the temperature range, are sensitive to solvents, are not sufficiently level and are a possible source of contamination.

Hence the object of the development is a new handling technology with which the ultrathin wafers could be machined like normal wafers in all normal machining devices without special adaptation. After machining, the usable wafer should be able to be detached from the carrier wafer in as convenient and problem-free a manner as possible. The carrier wafer should thereby be reusable and economical to produce.

Starting from the state of the art, it is therefore the object of the present invention to make available a carrier wafer and a wafer arrangement with which thin or ultrathin usable wafers can be handled in a simple, reliable manner which also avoids destruction, in particular fracture damage, of the usable wafer.

This object is achieved by the carrier wafer according to claim 1 or 2 and also the arrangement according to claim 17. Advantageous developments of carrier wafers and arrangements according to the invention are provided in the respective dependent claims.

According to the invention, ultrathin wafers or even individual usable chips, which are designated in the following in summary as flat components, are retained with the help of a mobile, electrostatic carrier wafer according to the invention. The components can hence be machined, transported and stored in the devices of the semiconductor industry.

According to the invention, the carrier layer (substrate) of the carrier wafer consists of an electrically insulating material or is covered by an electrically insulating cover layer which surrounds the carrier layer preferably completely.

An electrically conductive layer is applied hereon and is structured in at least two regions which are separated from each other electrically. This structuring is situated preferably on the front-side of the carrier wafer on which the electronic components are intended to be retained. The electrical layer thus forms at least two electrodes to which a voltage can be applied. In the electrical field thus generated on the front-side of the carrier wafer, the electronic components, for example chips or also usable wafers, are retained on the front-side of the carrier wafer.

On the rear-side of the carrier wafer, at least one electrical contact respectively is provided for each of the regions of the front-side which are present electrically insulated from each other. The contacting of the front-side electrodes with the rear-side electrical contacts is effected either via through-contactings through the carrier layer or preferably via a conductive region which extends from the front-side of the carrier wafer beyond the edge thereof towards the rear-side to the respective contact. The face, which delimits the wafer externally, between front- and rear-side, is designated as edge or also outer edge. The edge therefore delimits the entire diameter of the wafer. Border is also mentioned synonymously to edge and outer edge.

Finally, a further electrically insulating (dielectric) cover layer is applied on the electrically conductive layer surrounding the carrier wafer. Said cover layer covers at least the front-side of the carrier wafer and also the edge thereof whilst at least in regions it does not cover the rear-side electrical contacts so that electrodes can be connected there. This is achieved for example in that an outer dielectric is applied on the electrically conductive structured layer, said dielectric being partially etched free on the rear-side in order to expose the rear-side contacts.

According to the invention, an electrical component is now retained on the front-side by a voltage being applied to the rear-side contacts. In the bipolar electrostatic field between the front-side opposite-pole electrodes, the component is retained on the front-side of the carrier wafer. This sandwich comprising carrier wafer and component, for example usable wafer, can then be processed, in the case of a usable wafer as component, like a wafer of normal thickness in the devices widely used in this field, be transported by handlers and stored in wafer racks. This is possible in particular when the thickness of the arrangement comprising carrier wafer and component and/or the diameter of the arrangement comprising carrier wafer and component maintain the corresponding dimensions of a commercially available wafer or are within the tolerance limits thereof. For the thicknesses and the diameter of the arrangement, the normal tolerances in semiconductor technology for silicon wafers according to SEMI standard M1-0302 and M1.1 to M1.15 are advantageously maintained. In addition to a usable wafer with the same diameter as the carrier wafer as component, usable wafers which have a smaller diameter than the carrier wafer can also be processed. On the one hand, these can be slightly smaller, as a result of which problems with the very sharp edge of the ultrathin usable wafer can be avoided. However, also a smaller exotic usable wafer can be transported on a carrier wafer of normal size, e.g. a 3 inch germanium wafer on a 6 inch silicon wafer in order to use available devices.

As carrier layer of the carrier wafer, normal p- or n-doped monocrystalline silicon can be used advantageously. This is suitable in particular if silicon, germanium, germanium arsenide, silicon carbide, indium phosphide, indium gallium arsenic phosphide is used for the component to be retained. In this case, carrier- and usable wafer have a similar heat expansion. In this case, it is necessary to insulate the carrier layer by means of an electrically insulating layer from the electrically conductive electrodes.

Alternatively, also electrically insulating materials, such as for example silicon dioxide or silicon nitride $Si_3N_4$ can be used for the carrier layer. Then the electrically insulating layer which is applied directly on this carrier layer can be omitted.

Instead of a carrier layer made of electrically semiconductive material, it is also possible to use a carrier layer made of metal. This does not concern a wafer in the real sense, in this case, since the latter is normally defined as a thin disc made of semiconductor material, but rather a carrier wafer in an extended sense for which the definition of the wafer, with the exception of the material used for this purpose, is valid.

For the electrically insulating layers (between the carrier layer and the electrically conductive layer or above the electrically conductive layer), silicon dioxide is preferably used, advantageously as thermal oxide. However, also CVD-deposited silicon dioxide or even a silicon nitride can be used here.

For production of the bipolar electrodes on the front-side of the carrier wafer, firstly a conductive or dopable material, such as for example polycrystalline or amorphous silicon, is deposited advantageously over the full surface area or on the front-side, edge and rear-side of the carrier wafer. If a CVD process is used, then the deposition is effected on all sides without further assistance, i.e. on the front- and rear-side and at the edge at the same time.

However also metals or other layers which have electrical conductivity can be used as electrically conductive layer. The following materials are suitable in particular as conductive materials for the electrically conductive layer: amorphous silicon, polysilicon (both preferably doped with P, B or As), doped polysilicon, titanium nitride (TiN), deposited via CVD methods, titanium nitride (TiN), deposited by sputtering, silicides ($TaSi_2$, $WSi_2$, $MoSi_2$, $NiSi_2$, Co—$Si_2$ and the like), titanium (Ti), advantageously sputtered, tungsten (W), advantageously deposited via CVD methods, molybdenum (Mo), aluminium alloys (e.g. AlSi1%, AlSi1% Cu0.5, pure aluminium (Al), gold (Au), copper (Cu) and/or silver (Ag) and mixtures and alloys thereof.

Next, the electrically conductive layer is then structured on the front-side, for example via lithographic phototechniques (contact exposer or stepper) and a subsequent wet- or dry-chemical etching (plasma etching). The produced structure sizes and forms then subsequently determine the geometry of the electrical field. Particularly advantageously, the electrodes can be used in the form of circle sectors (cake pieces), interleaving circle rings with different radii or linear comb-like finger arrangements (interdigital condensers).

The subdivision of the electrodes into segments or zones is therefore undertaken only on the front-side. In addition, two places on the rear-side are structured externally as contactings. In order to configure the rear-side contacting of the electrodes economically, the electrically conductive layer is preferably guided around the wafer edge. This can be achieved in a particularly simple manner if, during structuring of the conductive layer, the wafer edge is covered with an etching-resistant tape at the corresponding places. Alternatively, in the case of a suitable lithography method, the otherwise normal varnish removal from the edge at the corresponding places at which the electrical layer is guided around from the front-side to the rear-side, can be dispensed with so that a strip conductor can be produced around the edge. As a further possibility it is possible to produce an edge coating of this type by means of a local selective deposition (for example laser direct writing).

Through-contacting through the carrier layer is possible as a time-consuming and costly contacting possibility between the front-side electrodes and the rear-side outer contacts. For this purpose however the corresponding holes must be bored, insulated internally and filled again to be conductive.

After completion of the structuring, a further dielectric, preferably again silicon dioxide, is deposited via CVD methods or thermally deposited, or even silicon nitride or a combination of materials or layers of this type is deposited on all sides. This electrically insulating layer can also be produced by means of a material which can be permanently polarised electrically, as a result of which secure mounting of the component on the front-side of the carrier wafer can be ensured over a fairly long time period.

The rear-side contact is now produced in that the rear-side contact faces of the electrically conductive layer are exposed, for example etched free or mechanically exposed. Advantageously, the entire rear-side can also be structured lithographically and etched free taking care to exclude the edge. In the case of highly doped silicon as electrically conductive layer, a sufficiently good ohmic contact then already exists.

This now structured insulation layer hence then covers again the front-side of the wafer, the edge and the wafer edge on all sides and is only opened at the contacting points of the rear-side or in the region thereof. As a result, it is then possible to charge or recharge the carrier wafer at any time by means of two contacts, for example measuring peaks, from the rear-side.

The carrier wafer according to the invention is operated according to the principle of the bipolar E-chuck. The thin wafer to be machined or the chips to be machined are placed on the carrier wafer. The two wafers or wafer and chips can be regarded as individual faces of a plate condenser which are connected in parallel. The electrical field is for the large part orientated vertically between carrier wafer and usable wafer or usable chips. The charging of the plate condensers takes place by placing the carrier wafer on a corresponding auxiliary device and temporary contacting of the carrier wafer from the rear-side with two high voltage electrodes. This electrical field exerts a retaining electrostatic force on the usable wafer or on the individual chips. The usable retaining force thereby increases the thinner the dielectric is. According to experience, the usable wafer is retained all the more securely the thinner it is. The necessary voltage is based on the thickness of the insulator and upon the required field strength and hence upon the retaining force and is typically 50 to 500 V.

The combination of carrier wafer and thin usable wafer or usable chips now forms an inseparable unit which can be machined like a normal wafer by a machining device. It can be transported also by normal handlers and in racks.

After or during the machining, transportation or storage, the retaining force can be refreshed again if required by recharging. The duration of reliable retention is produced from the insulation property of the dielectric and the surrounding air or the surrounding media and extends from approx. one hour to days.

At the end of machining, the usable wafer or the usable chips are separated from the carrier wafer by simple discharging. Experience with electrostatic chucks shows that a temporary or periodic pole reversal can thereby sometimes be necessary to neutralise trapped charges. The usable wafer can hence be transferred onto a carrier by adhesion or vacuum technology or be supplied by mounting and connection technics.

Figure 2:
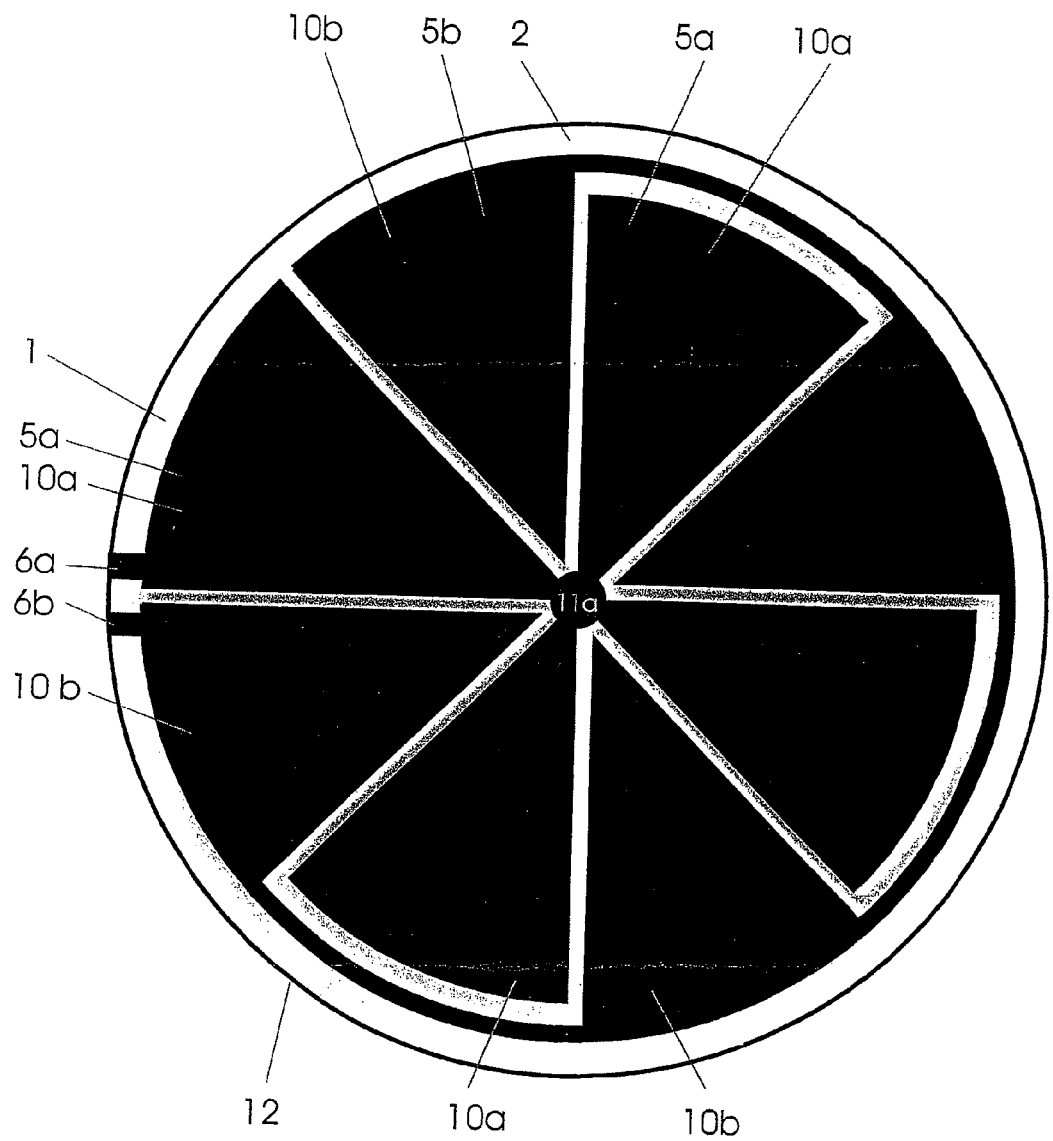
Figure 3:
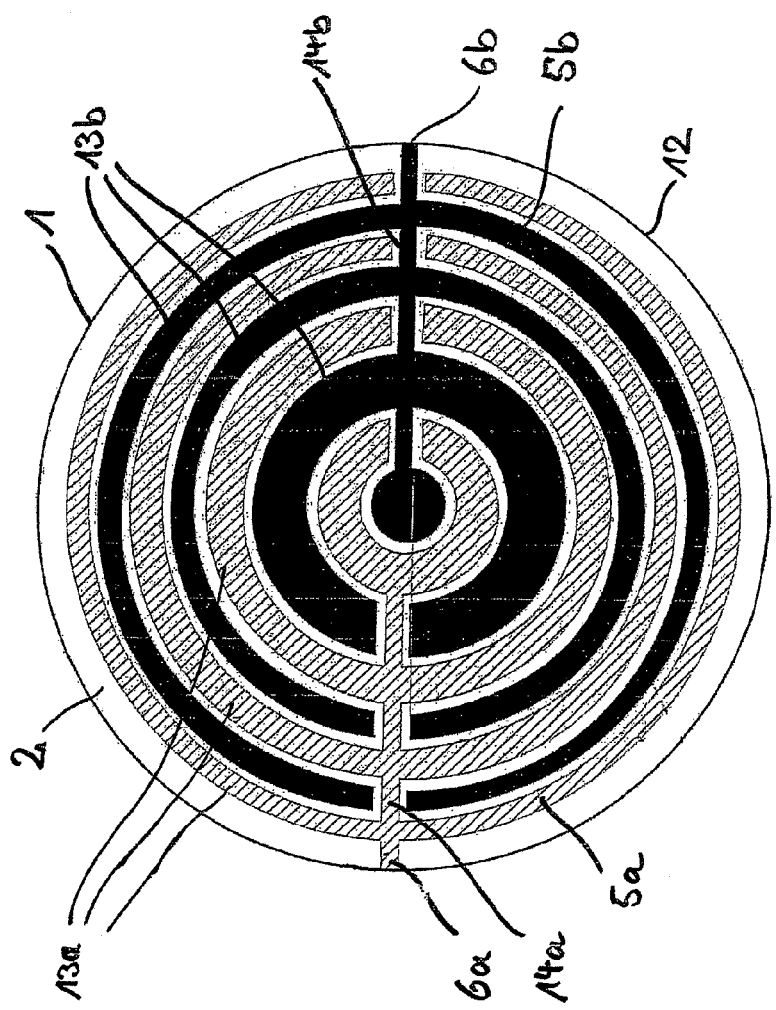
Figure 4:
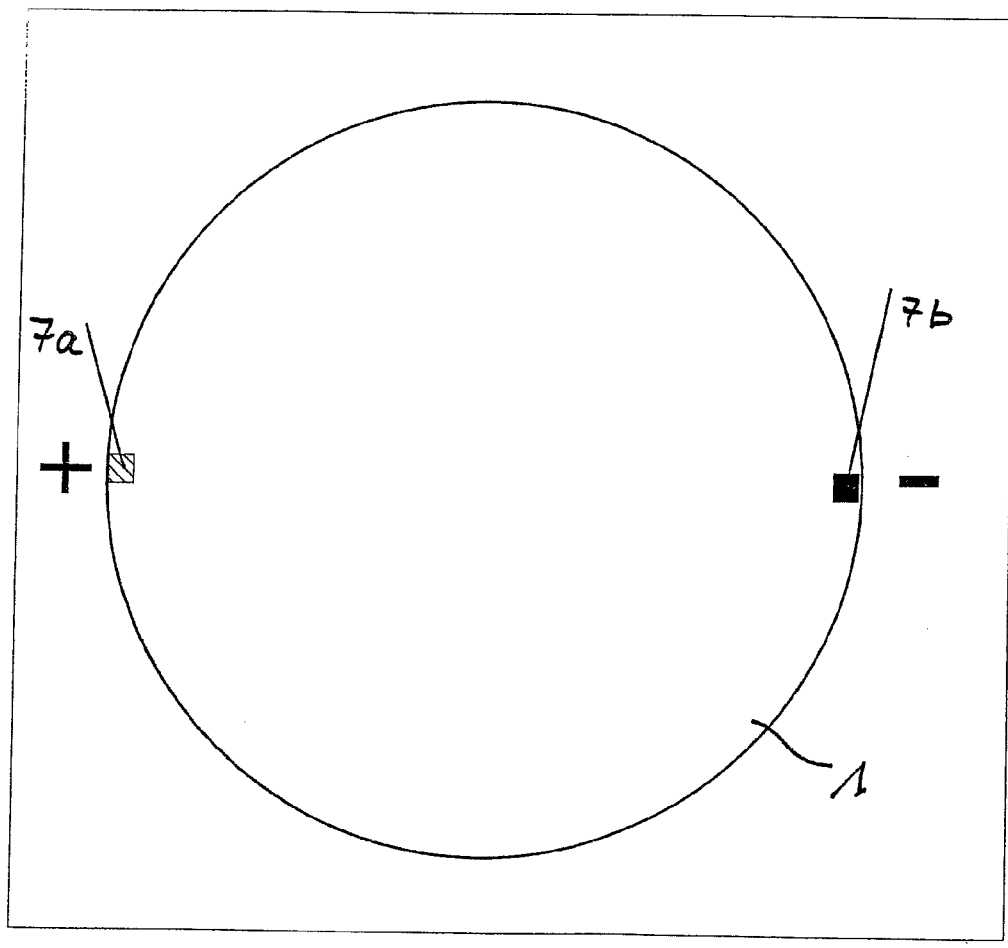

In the following, some examples of carrier wafers and arrangements according to the invention are provided. There are shown FIG. 1 an arrangement according to the invention in a lateral sectional view;

FIG. 2 the plan view on the front-side of a carrier wafer according to the invention;

FIG. 3 the plan view on the front-side of a further carrier wafer according to the invention; and FIG. 4 the rear-side of a carrier wafer with contact faces.

FIG. 1 shows the cross-section through an arrangement as described in the present invention. Here as in the following Figures, the same or similar reference numbers thereby designate the same or similar elements.

The arrangement is constructed from a carrier wafer 1, on the front-side of which a disc-shaped semiconductor component, here an ultrathin usable wafer 15, is retained. The carrier wafer 1 has a carrier layer 2 made of monocrystalline silicon which is surrounded on all sides by an electrically insulating layer 3 made of silicon dioxide $SiO_2$. An electrically conductive layer 4 is disposed on this dielectric layer 3 and is structured in two regions 4a and 4b which are separated from each other electrically. The electrically conductive regions 4a or 4b have front-side regions 5a or 5b, a lateral region 6a or 6b which surrounds the edge of the carrier layer 2 and rear-side regions 7a or 7b. All the regions 4a, 5a, 6a and 7a are connected to each other in an electrically conductive manner, whilst all the electrical regions 4b, 5b, 6b and 7b, for their part, are connected to each other in an electrically conductive manner. These two electrically conductive coatings are mutually insulated from each other electrically. The front-side electrical regions 5a, upon application of a suitable voltage to the region 7a used as rear-side contact, should be regarded as positive pole, whereas the front-side regions 5b, upon application of a negative voltage to the rear-side region 7b operating as electrical contact, should be regarded as negative pole. The contacting between the rear-side contact 7a and 7b and the front-side electrodes 5a and 5b, respectively, is effected via the edge-encompassing regions 6a or 6b. Between the front-side electrodes 5a and 5b, electrical fields which hold the usable wafer 15 securely on the surface of the carrier wafer 1 are now formed. The carrier wafer is surrounded overall on all sides by a further electrically insulating layer 8 so that the electrically conductive coating 4a, 5a, 6a and 4b, 5b, 6b are separated electrically from the usable wafer 15. Merely the rear-side contact regions 7a or 7b are left free of the electrically insulating layer 8 which again comprises silicon dioxide so that it is possible to apply voltages to these regions 7a and 7b through the openings 9a and 9b in the electrically insulating layer 8.

FIG. 2 now shows the plan view on the front-side of a carrier wafer according to the invention. On the front-side, this carrier wafer has a structured electrically conductive coating, the diameter of which is slightly less than the total diameter of the carrier wafer which is characterised by the wafer edge 12. The coating in the regions 5a and 5b which are separated from each other electrically is structured in a segment-like manner, the individual circle segments being characterised with 10a or 10b. Respectively adjacent circle segments are part of the different coating regions 5a or 5b. The circle segments 10a which are part of the coating 5a are connected to each other in an electrically conductive manner via a common electrically conductive region 11a and are through-contacted to the rear-side of the carrier wafer 1 via a strip conductor 6a which is guided over the edge 12 of the carrier wafer 1.

The circle segments 10b associated with the electrically conductive region 5b are connected to each other in an electrically conductive manner via electrical strip conductors 11b and are through-contacted to the rear-side of the wafer 1 via an electrical strip conductor 6b. The strip conductor 6b is guided over the edge 12 of the carrier wafer 1.

On a carrier wafer structured in this manner, particularly advantageously ultrathin usable wafers can be retained.

FIG. 3 now shows the plan view on the front-side of a further carrier wafer 1 in which the electrically conductive regions 13a, 14a or 13b, 14b associated with the conductor regions 5a or 5b are configured as an annular arrangement. The conductor regions 13a or 13b are annular and connected to each other in an electrically conductive manner at a place along the circumference of the carrier wafer 1 by means of radially electrically conductive regions 14a or 14b. The radial electrically conductive regions 14a and 14b are disposed on the carrier wafer 1 diametrically relative to each other and extend at places which are situated diametrically relative to each other up to the edge 12 of the wafer 1. At these respective places, they are through-contacted respectively by strip conductors 6a or 6b over the edge 12 to the rear-side of the carrier wafer 1.

FIG. 4 shows the rear-side of the carrier wafer 1 represented in FIG. 3. The contacts which are connected in an electrically conductive manner to the strip conductors 6a and 6b on the front-side and the edge of the carrier wafer 1 for applying a voltage to the annular regions 13a, 14a, 13b and 14b are designated with the reference number 7a or 7b. The contact 7a thereby forms the positive pole whilst the contact 7b forms the negative pole.

By means of the carrier wafer represented in FIGS. 3 and 4, likewise ultrathin usable wafers can be retained. It is also possible to clamp individual chips as semiconductor components.

In the case of FIG. 1, the carrier wafer 1 has the same nominal diameter (extension a in the longitudinal direction) as the usable wafer 15. The usable wafer 15 is accordingly likewise configured as a very flat cylinder. Furthermore, the carrier wafer 1 fulfils the same tolerance requirements as are placed on the usable wafer 15. In the present case of a so-called 6 inch wafer, the diameter is 150 mm, the tolerance for this dimension a is +/−0.2 mm. In order to avoid problems with the sharp-edged border of the ultrathin usable wafer 15, the usable wafer 15 is however, in this example, slightly smaller (a few mm) in diameter than the carrier wafer 1. In order, in a machining machine, such as for example a plasma etcher, to avoid undesired etching on or, in a plasma depositor, undesired coating of the carrier wafer 1, it can be sensible to configure the carrier wafer 1 or the carrier layer 2 to be slightly smaller (i.e. a few mm) in diameter than the usable wafer 15. As a result, the carrier wafer 1 is protected by screening from the plasma. The carrier wafer 1 can hence also be slightly smaller in diameter than normal wafers which are standard in semiconductor technology (see subsequently the cited Table).

The carrier wafer 1 is produced with such a thickness D that the sum D+d+i of the thicknesses D of the carrier layer 2, of the electrically conductive layer 4, i of the electrically insulating layers 3 and 8 and d of the thin usable wafer 15 is within the thickness tolerance for wafers of this diameter. In other words the total thickness of the wafer arrangement has a value which corresponds to a thickness value as can be handled normally by standard handling devices of the semiconductor industry. With a diameter of a=150 mm, this total thickness is generally in the range of 655 to 695 μm. Hence the combination of carrier wafer 1 and usable wafer 15 appears as of normal thickness for a machining device. More conveniently, a wafer of standard thickness is used as carrier wafer 1 and merely ensures fulfilment of the thickness tolerance by selection of the batch. However for higher requirements, the carrier wafer 1 can thus also be produced to a necessary thickness in that a wafer is thinned by the thickness of the usable wafer 15.

Of course, the wafer arrangement can however also have other diameters and total thicknesses. The wafers common in semiconductor technology are 2, 3, 4, 5, 6, 8 and 12 inch wafers. The tolerance values which apply to these wafers according to the SEMI Standard M1-0302 and M1.1 to M1.15 for the diameter a and the total thickness D+i+d can be deduced from the subsequent Table. The wafer arrangement can hence likewise have the diameters a and thicknesses D+d+i which are indicated in the Table, with the respectively indicated tolerance values.

| Diameter a | Tolerance of a | Thickness D + i + d | Tolerance of D + i + d |
|---|---|---|---|
| 50.8 mm | ±0.38 mm | 279 μm | ±25 μm |
| 76.2 mm | ±0.63 mm | 381 μm | ±25 μm |
| 100 mm | ±0.5 mm | 525 μm | ±20 μm |
| 125 mm | ±0.5 mm | 625 μm | ±20 μm |
| 150 mm | ±0.2 mm | 675 μm | ±20 μm |
| 200 mm | ±0.2 mm | 725 μm | ±20 μm |
| 300 mm | ±0.2 mm | 775 μm | ±20 μm |

A silicon wafer in its unchanged form of a single-piece, continuous plate without the introduction of borings, channels or the like is used here as carrier wafer 15.

In the case of FIGS. 2 and 3, the electrically insulating layer between the carrier layer and the electrically conductive layer can be omitted if an electrically insulating material is used already as carrier layer 2.

The present invention makes available therefore a mobile, bipolar electrostatic carrier wafer, with which semiconductor components, such as for example ultra-thin wafers or also individual chips, can be retained and hence machined, transported and stored in devices of the semiconductor industry. By applying a voltage to the electrically conductive layer of the carrier wafer, a bipolar electrostatic field is constructed between the counter-pole electrodes on the front-side of the carrier wafer which holds the semiconductor component securely. This sandwich comprising carrier and semiconductor component, in particular carrier wafer and usable wafer, can then be machined in devices like a wafer of normal thickness, can be transported by handlers and stored in wafer racks.

The invention claimed is:

1. A carrier wafer for mounting a disc-shaped semiconductor component, having a front side and a rear side situated opposite the front side, the carrier wafer comprising a first carrier layer, a first electrically insulating cover layer, a second electrically insulating cover layer which surrounds the first carrier layer, a third electrically conductive layer which is disposed on the second electrically insulating cover layer and includes at least two regions which are separated from each other electrically, each of the regions having an electrode on the front side of the carrier wafer and an electrical contact on the rear side of the carrier wafer, the electrical contact connected to the electrode in an electrically conductive manner, the first electrically insulating cover layer disposed on the third electrically conductive layer and covering at least the front side and an edge of the carrier wafer between the front side and the rear side, at least one of the at least two regions of the third electrically conductive layer having a conductor section which extends from the front side of the carrier wafer around an outer edge of the first carrier layer to the rear side of the carrier wafer and connects the electrode and the electrical contact of the at least one of the at least two regions in an electrically conductive manner.

2. A carrier wafer for mounting a disc-shaped semiconductor component, having a front side and a rear side which is situated opposite the first surface, the carrier wafer comprising a carrier layer made of an electrically insulating material, an electrically conductive layer which is disposed on the carrier layer and comprises at least two regions which are separated from each other electrically, each of the at least two regions having an electrode on the front side of the carrier wafer and an electrical contact which is connected to the electrode in an electrically conductive manner on the rear side of the carrier wafer, a first electrically insulating cover layer which is disposed on the electrically conductive layer and covers at least the front side and an edge of the carrier wafer between the front side and the rear side, at least one of the at least two regions of the electrically conductive layer having a conductor section which extends from the front side of the carrier wafer around an outer edge of the carrier layer to the rear side of the carrier wafer and connects the electrode and the electrical contact of the at least one of the at least two regions in an electrically conductive manner.

3. A carrier wafer according to claim 2 wherein the first electrically insulating cover layer surrounds the carrier layer completely with the exception of the electrical contacts.

4. A carrier wafer according to claim 2 wherein the carrier layer has at least one through-contact which connects the electrode and the electrical contact of the at least one of the at least two regions in an electrically conductive manner.

5. A carrier wafer according to claim 2 wherein the electrically conductive layer comprises at least one of a metal, a metal alloy, a metal silicide and a suitable doped material.

6. A carrier wafer according to claim 5 wherein the electrically conductive layer comprises at least one of n-doped semiconductor material and p-doped semiconductor material.

7. A carrier wafer according to claim 6 wherein the electrically conductive layer comprises at least one of doped monocrystalline silicon, polycrystalline silicon and amorphous silicon.

8. A carrier wafer according to claim 6 wherein the doping agent concentration of the semiconductor is between about $10^{14}$ atoms/cm$^3$ and about $10^{22}$ atoms/cm$^3$.

9. A carrier wafer according to claim 5 wherein the electrically conductive layer comprises at least one of tungsten, titanium and titanium nitride.

10. A carrier wafer according to claim 2 wherein the electrodes are selected from the group consisting of interdigital electrodes, circle segments, concentric rings and ring portions.

11. A carrier wafer according to claim 2 wherein the carrier layer comprises at least one of Si, a III-V semiconductor, AlGaAsP, Ge, GaAs, SiC, InP and InGaAs.

12. A carrier wafer according to claim 2 wherein at least one of the electrically insulating cover layers comprises silicon dioxide.

13. A carrier wafer according to claim 8 wherein the doping agent concentration of the semiconductor is between about $10^{15}$ atoms/cm$^3$ and about $10^{21}$ atoms/cm$^3$.

14. A carrier wafer according to claim 6 wherein the doping agent is selected from B, P and As.

15. A carrier wafer according to claim 1 wherein the carrier layer has at least one through-contact which connects the electrode and the electrical contact of the at least one of the at least two regions in an electrically conductive manner.

16. A carrier wafer according to claim 1 wherein the electrically conductive layer comprises at least one of a metal, a metal alloy, a metal silicide and a suitable doped material.

17. A carrier wafer according to claim 16 wherein the electrically conductive layer comprises at least one of n-doped semiconductor material and p-doped semiconductor material.

18. A carrier wafer according to claim 17 wherein the electrically conductive layer comprises at least one of doped monocrystalline silicon, polycrystalline silicon and amorphous silicon.

19. A carrier wafer according to claim 17 wherein the doping agent concentration of the semiconductor is between about $10^{14}$ atoms/cm$^3$ and about $10^{22}$ atoms/cm$^3$, preferably above $10^{15}$ atoms/cm$^3$ and/or below $10^{21}$ atoms/cm$^3$ and/or in that B, P and/or As is used as doping agent.

20. A carrier wafer according to claim 17 wherein the doping agent concentration of the semiconductor is between about $10^{15}$ atoms/cm$^3$ and about $10^{21}$ atoms/cm$^3$.

21. A carrier wafer according to claim 17 wherein the doping agent is selected from B, P and As.

22. A carrier wafer according to claim 16 wherein the electrically conductive layer comprises at least one of tungsten, titanium and titanium nitride.

23. A carrier wafer according to claim 1 wherein the electrodes are selected from the group consisting of interdigital electrodes, circle segments, concentric rings and ring portions.

24. A carrier wafer according to claim 1 wherein the carrier layer comprises at least one of Si, a III-V semiconductor, AlGaAsP, Ge, GaAs, SiC, InP and InGaAs.

25. A carrier wafer according to claim 1 wherein at least one of the electrically insulating cover layers comprises silicon dioxide.

* * * * *